United States Patent
Morimoto et al.

(10) Patent No.: US 10,438,862 B2
(45) Date of Patent: Oct. 8, 2019

(54) ELECTROMAGNETIC SHIELD STRUCTURE OF HIGH FREQUENCY CIRCUIT AND HIGH FREQUENCY MODULE

(71) Applicant: Mitsubishi Electric Corporation, Tokyo (JP)

(72) Inventors: Yasuo Morimoto, Tokyo (JP); Hideharu Yoshioka, Tokyo (JP); Akimichi Hirota, Tokyo (JP); Naofumi Yoneda, Tokyo (JP); Takuma Ishibashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/770,848

(22) PCT Filed: Dec. 24, 2015

(86) PCT No.: PCT/JP2015/085952
§ 371 (c)(1),
(2) Date: Apr. 25, 2018

(87) PCT Pub. No.: WO2017/109878
PCT Pub. Date: Jun. 29, 2017

(65) Prior Publication Data
US 2018/0308776 A1 Oct. 25, 2018

(51) Int. Cl.
*H01L 23/04* (2006.01)
*H01L 23/02* (2006.01)
(Continued)

(52) U.S. Cl.
CPC .............. *H01L 23/04* (2013.01); *H01L 23/02* (2013.01); *H01L 23/12* (2013.01); *H01L 23/36* (2013.01);
(Continued)

(58) Field of Classification Search
CPC . H01L 23/12; H01L 23/02; H01L 2933/0033; H01L 23/49827;
(Continued)

(56) References Cited

U.S. PATENT DOCUMENTS 5,533,256 A * 7/1996 Call .................... H01L 23/3675
174/16.3
5,552,635 A 9/1996 Kim et al.
(Continued)

FOREIGN PATENT DOCUMENTS

JP 7-254668 A 10/1995
JP 10-41678 A 2/1998
(Continued)

OTHER PUBLICATIONS

International Search Report for PCT/JP2015/085952 (PCT/ISA/210) dated Mar. 15, 2016.
(Continued)

*Primary Examiner* — Mandeep S Buttar
(74) *Attorney, Agent, or Firm* — Birch, Stewart, Kolasch & Birch, LLP

(57) ABSTRACT

A recess in a metal housing accommodating a high frequency package includes a first space and a second space and has a winners podium shape in cross-sectional view. A thermally conductive material is sandwiched between the metal housing having heat dissipating fins and the high frequency package.

8 Claims, 8 Drawing Sheets

(51) Int. Cl.
*H01L 23/552* (2006.01)
*H01L 23/66* (2006.01)
*H01L 23/367* (2006.01)
*H01L 23/12* (2006.01)
*H01L 23/36* (2006.01)

(52) U.S. Cl.
CPC .......... *H01L 23/367* (2013.01); *H01L 23/552* (2013.01); *H01L 23/66* (2013.01); *H01L 23/3677* (2013.01); *H01L 2223/6627* (2013.01); *H01L 2224/16225* (2013.01); *H01L 2224/73253* (2013.01); *H01L 2924/15313* (2013.01); *H01L 2924/1615* (2013.01); *H01L 2924/16152* (2013.01); *H01L 2924/16235* (2013.01); *H01L 2924/16251* (2013.01)

(58) Field of Classification Search
CPC ............ H01L 23/3672; H01L 23/3675; H01L 23/3677; H01L 23/3736; H05K 1/0218; H05K 1/0243; H05K 1/0203; H05K 3/3436; H05K 1/0219; H05K 1/0222; H05K 1/0237; H05K 2201/10734; H05K 7/20418; H05K 7/20409; H05K 2201/10969; H05K 9/0075; H05K 9/0081; G06F 1/1656
USPC ....... 361/818, 719, 816, 704, 718, 764, 783, 361/800; 257/678, E23.114, 728; 439/108, 607.01
See application file for complete search history.

(56) References Cited

U.S. PATENT DOCUMENTS

| | | | |
|---|---|---|---|
| 6,617,683 B2 * | 9/2003 | Lebonheur | H01L 23/433 257/707 |
| 7,327,027 B2 * | 2/2008 | Houle | H01L 23/3736 257/706 |
| 9,362,209 B1 * | 6/2016 | Mangrum | H01L 23/043 |
| 2003/0218238 A1 | 11/2003 | Kikuchi et al. | |
| 2006/0205118 A1 | 9/2006 | Hwang et al. | |
| 2009/0039503 A1 | 2/2009 | Tokita et al. | |
| 2017/0374764 A1 * | 12/2017 | Chauhan | H05K 7/20336 |

FOREIGN PATENT DOCUMENTS

| | | |
|---|---|---|
| JP | 2000-59072 A | 2/2000 |
| JP | 2000-236045 A | 8/2000 |
| JP | 2003-258142 A | 9/2003 |
| JP | 2005-12127 A | 1/2005 |
| JP | 2006-210940 A | 8/2006 |
| JP | 2006-229220 A | 8/2006 |
| JP | 2008-306064 A | 12/2008 |

OTHER PUBLICATIONS

Japanese Office Action dated Jul. 14, 2016 in Japanese Patent Application No. 2016-534271.

* cited by examiner

ELECTROMAGNETIC SHIELD STRUCTURE OF HIGH FREQUENCY CIRCUIT AND HIGH FREQUENCY MODULE

TECHNICAL FIELD

The present invention relates to an electromagnetic shield structure of a high frequency circuit in a high frequency module such as wireless communication devices or radar devices which achieves all of: suppression of spatial coupling of electromagnetic wave, namely, suppression of unnecessary coupling among high frequency circuits mounted in the high-frequency module; high isolation of circuits; and high heat dissipation performance of a high frequency circuit.

BACKGROUND ART

Generally, in order for the isolation of a high frequency circuit to be sufficiently high within the operating frequencies of the circuit, the sizes of a high frequency module and its packaging are designed such that the cutoff frequency is sufficiently high when a waveguide is configured, and the resonant frequency is sufficiently high when a cavity is configured.

For example, in a high frequency module described in Patent Literature 1, a space in the high frequency module in which a semiconductor chip is mounted, namely, a cavity, is formed to be a winners podium shape or a three-step winners podium shape, and consequently, the cavity resonant frequency or the waveguide cutoff frequency is increased.

Further, since a high frequency package generates a large amount of heat in general, it is required to provide a structure for heat dissipation.

For example, in the high frequency module described in Patent Literature 2, heat radiating fins are integrally formed with a metal casing in which a high frequency package is mounted, and a thermally conductive sheet is arranged between the high frequency package and the metal casing to enhance the heat dissipation performance of the high frequency package.

CITATION LIST

Patent Literature

[PLT 1]
Japanese unexamined Patent Application Publication No. 2000-236045
[PLT 2]
Japanese unexamined Patent Application Publication No. 2008-306064

SUMMARY OF INVENTION

Technical Problem

In the high frequency module described in Patent Literature 1, the dissipation path of the heat generated by a semiconductor chip exists only in the direction along the substrate on which the semiconductor chip is mounted, so that there is a problem that heat dissipation performance may not be enough.

In the high frequency module described in Patent Literature 2, a thermally conductive sheet is arranged in a space in which a high frequency package is arranged. Due to the relative permittivity of the thermally conductive sheet, the wavelength is shortened, and thus the cavity resonant frequency or the waveguide cutoff frequency is decreased, which is a problem to be solved.

Conventionally, no configuration for solving both of the above two problems has been proposed.

The present invention is made to solve the above problems, and an object thereof is to provide an electromagnetic shield structure of a high frequency circuit that can increase the cavity resonant frequency or waveguide cutoff frequency and that enhances the heat dissipation performance of the high frequency circuit.

Solution to Problem

According to the present invention, an electromagnetic shield structure of a high frequency circuit includes: a dielectric substrate provided with a grounding conductor and on which the high frequency circuit is mounted; a metal housing in which a recess accommodating the high frequency circuit is formed, fixed to the dielectric substrate to be electrically connected to the grounding conductor; and a thermally conductive material being electrically insulative. The metal housing includes a heat dissipation structure. The recess forms a first space and a second space, in which the first space is defined by a first bottom face which faces the high frequency circuit and a first side face which stands from the first bottom face, the second space is defined by a second bottom face which faces the high frequency circuit and is positioned in a shallower part in the recess than the first bottom face and a second side face which stands from the second bottom face, and the second space is formed to be protruded from the first space to an outer peripheral side. The high frequency circuit is accommodated in the second space to be spaced from the metal housing, and the thermally conductive material is sandwiched between the first bottom face or second bottom face and the high frequency circuit.

Advantageous Effect of Problem

According to the present invention, a recess in a metal housing accommodating the high frequency circuit has a first space and a second space. The first space is defined by a first bottom face and a first side face which stands from the first bottom face. The second space is defined by a second bottom face which is positioned in a shallower part in the recess than the first bottom face and a second side face which stands from the second bottom face, and the second space is formed to be protruded from the first space to an outer peripheral side. The thermally conductive material is sandwiched between the first bottom face or second bottom face of the metal housing provided with a heat dissipation structure. As a result, in an electromagnetic shield structure of a high frequency circuit, the cavity resonant frequency or waveguide cutoff frequency can be increased and the heat dissipation performance of the high frequency circuit is enhanced.

DESCRIPTION OF EMBODIMENTS

Some embodiments of the present invention will now be described in more detail with reference to the accompanying drawings.

Embodiment 1

Figure 1:
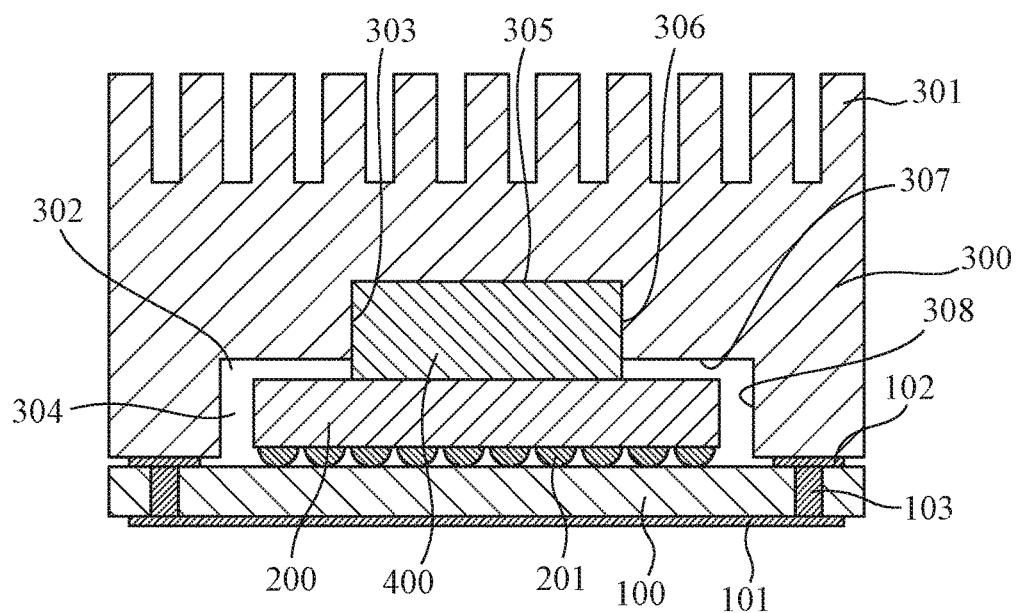
FIG. 1 is a cross-sectional view illustrating an electromagnetic shield structure of a high frequency circuit according to Embodiment 1 of the present invention.

FIG. 1 is a cross-sectional view of a high frequency module for showing an electromagnetic shield structure of a high frequency circuit according to Embodiment 1 of the present invention. The electromagnetic shield structure of the high frequency circuit is disposed in a high frequency module. The high frequency module is used in, for example, wireless communication devices, radar devices, or the like.

On a dielectric substrate 100, a high frequency package 200 whose shape is substantially rectangular parallelepiped including the high frequency circuit is mounted by a ball grid array (BGA) of solder bumps 201.

The metal housing 300 is a member having a shape of a case whose appearance is substantially rectangular parallelepiped and is fixed to a dielectric substrate 100 to cover the mounted high frequency package 200 by, for example, screwing. The metal housing 300 includes heat dissipating fins 301 integrally formed with the metal housing 300 and standing from a face of the metal housing 300 opposite to the face that faces the dielectric substrate 100. The metal housing 300 has a face opposing to the dielectric substrate 100 which is partially recessed to form a recess 302 whose cross sectional shape is a winners podium shape.

The recess 302 whose cross sectional shape is a winners podium shape has a first space 303 and a second space 304 protruded further from the first space 303 to the outer peripheral side.

The first space 303 has a substantially rectangular parallelepiped shape defined by a first bottom face 305, facing the high frequency package 200 and sandwiching the thermally conductive material 400 with the high frequency package 200, and a first side face 306, standing from the first bottom face 305 toward the dielectric substrate 100. The first side face 306 is a set of faces connecting the first bottom face 305 and a second bottom face 307 described below.

The second space 304 has a substantially rectangular parallelepiped shape defined by a second bottom face 307, facing the high frequency package 200 and positioned in a shallower part in the recess than the first bottom face 305, and a second side face 308 stands from the second bottom face 307 toward the dielectric substrate 100.

The first space 303 in the recess 302 is filled with the thermally conductive material 400. The second space 304 in the recess 302 accommodates the high frequency package 200 to be spaced from the metal housing 300.

On a face of the dielectric substrate 100 on which the high frequency package is mounted on, a grounding conductor 102 is formed as a grounding conductor pattern in an outer peripheral side than the high frequency package 200. On the rear face of the above face of the dielectric substrate 100, a grounding conductor 101 is formed as a grounding conductor pattern. The grounding conductor 101 and the grounding conductor 102 are electrically connected to each other via a pillar conductor 103 formed to penetrate the dielectric substrate 100. After the metal housing 300 is fixed to the dielectric substrate 100 by, for example, screwing, it comes into contact with the grounding conductor 102 and is electrically connected to the grounding conductors 101 and 102 and the pillar conductor 103.

The thermally conductive material 400 has excellent thermal conductivity and electrical insulation, and is a member having a rectangular parallelepiped shape and sandwiched by faces of the metal housing 300 in which a recess 302, defined by the first bottom face 305, the first side face 306, the second bottom face 307, and the second side face 308, is formed, and the high frequency package 200. More specifically, the thermally conductive material 400 is sandwiched between the first bottom face 305 and the high frequency package 200 in a state where it is in contact with both the first bottom face 305 and the high frequency package 200. The thermally conductive material 400 conducts the heat generated in the high frequency package 200 to the metal housing 300. The thermally conductive material 400 is formed by, for example, silicon. Alternatively, the thermally conductive material 400 may be formed by resin material containing metal or carbon.

Some effects of the electromagnetic shield structure of the high frequency circuit configured as explained above will now be described with reference to some results of an electromagnetic field analysis based on the finite element method.

Figure 2:
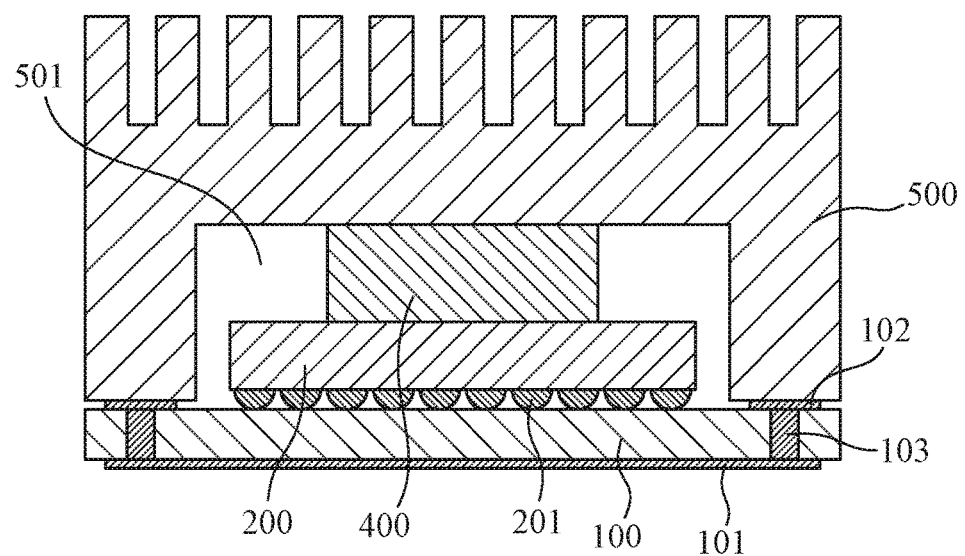
FIG. 2 is a cross-sectional view illustrating a reference example for supporting understanding of the electromagnetic shield structure of the high frequency circuit in FIG. 1.

A reference example is illustrated in FIG. 2 for supporting understanding of the electromagnetic shield structure of the high frequency circuit in FIG. 1. The electromagnetic shield structure of the high frequency circuit in FIG. 2 differs from that in FIG. 1 in that a metal housing 500 has a recess 501 with a rectangular shape in cross-sectional view.

Figure 3A:
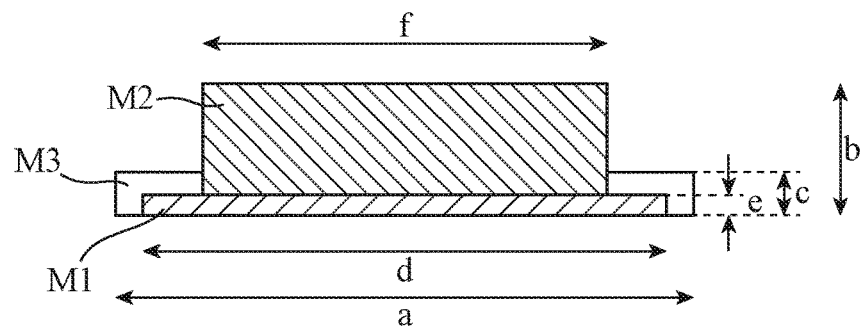
FIG. 3A is a structural view for an electromagnetic analysis of the electromagnetic shield structure of the high frequency circuit illustrated in FIG. 1.
Figure 3B:
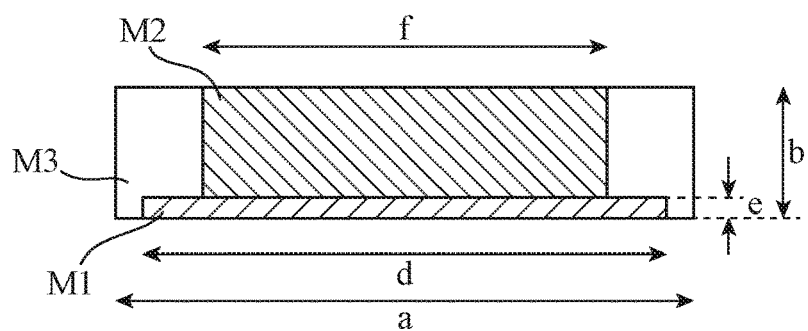
FIG. 3B is a structural view for an electromagnetic analysis of the electromagnetic shield structure of the high frequency circuit illustrated in FIG. 2.

FIGS. 3A and 3B are structural views for the electromagnetic field analysis being cross-section views of waveguides. FIG. 3A corresponds to the electromagnetic shield structure of the high frequency circuit shown in FIG. 1, whereas FIG. 3B corresponds to that illustrated as a reference example shown in FIG. 2. When the waveguides shown in FIG. 3A and FIG. 3B are seen from the right or left of the drawing sheet, the cross sectional views thereof are the same as those shown in FIG. 3A and FIG. 3B, respectively.

In the electromagnetic field analysis, the modeling is implemented as follows. The high frequency package 200 corresponds to silicon M1 having a relative permittivity of 10. The thermally conductive material 400 corresponds to thermally conductive material M2 having a relative permittivity of 4. The second space 304 and the space formed by the recess 501 correspond to the air M3 having a relative permittivity of 1. The dimensions shown in FIGS. 3A and 3B are assumed to be the followings: a: 6.0 [mm], b: 1.5 [mm], c: 0.5 [mm], d: 5.0 [mm], e: 0.3 [mm], and f: 4.0 [mm]. In FIGS. 3A and 3B, the same numerals indicate the same dimensions or the same materials.

As a result of the electromagnetic field analysis, the cutoff frequency of the waveguide shown in FIG. 3A is 14.3 [GHz], and that in FIG. 3B is 11.8 [GHz]. As shown in this result, As shown in this result, the electromagnetic shield structure of the high frequency circuit according to Embodiment 1, in which the recess 302 for accommodating the high frequency package 200 is formed to have the first and second spaces 303 and 304 such that its cross-section is a winners podium shape, increases the cutoff frequency to be higher than that of the electromagnetic shield structure of the high frequency circuit of the reference example which does not have such a configuration. Hence, in the electromagnetic shield structure of the high frequency circuit according to Embodiment 1, the cavity resonant frequency is also increased.

The heat dissipation performance is high because the high frequency package 200 is in contact with the metal housing 300 having heat dissipating fins 301 via the thermally conductive material 400. Further, the wider the contact area of the thermally conductive material 400 with the high frequency package 200 or the metal housing 300 is, the higher the heat dissipation performance becomes. As illustrated in FIG. 1, when the thermally conductive material 400 is in contact with the first side face 306, it is possible to enhance the heat dissipation performance further in the electromagnetic shield structure of the high frequency circuit according to Embodiment 1.

It should be noted that, in the above, a case where the heat dissipating fins 301 are provided as a heat dissipation structure is explained. Instead of the heat dissipating fins 301, the metal housing 300 may include a heat pipe as a heat dissipation structure. Such a structure can also be applied to Embodiments 2 and 3 described later. Namely, it is enough for the metal housing 300 to include any heat dissipation structure for facilitating heat dissipation to the exterior of the metal housing 300.

Further, in the above, a high frequency circuit is assumed to be packaged with other components or other high frequency circuits in a high frequency package 200. Alternatively, a high frequency circuit may be mounted on a dielectric substrate 100 without such packaging. Such a configuration can also be applied to Embodiments 2 and 3 described later.

Figure 4:
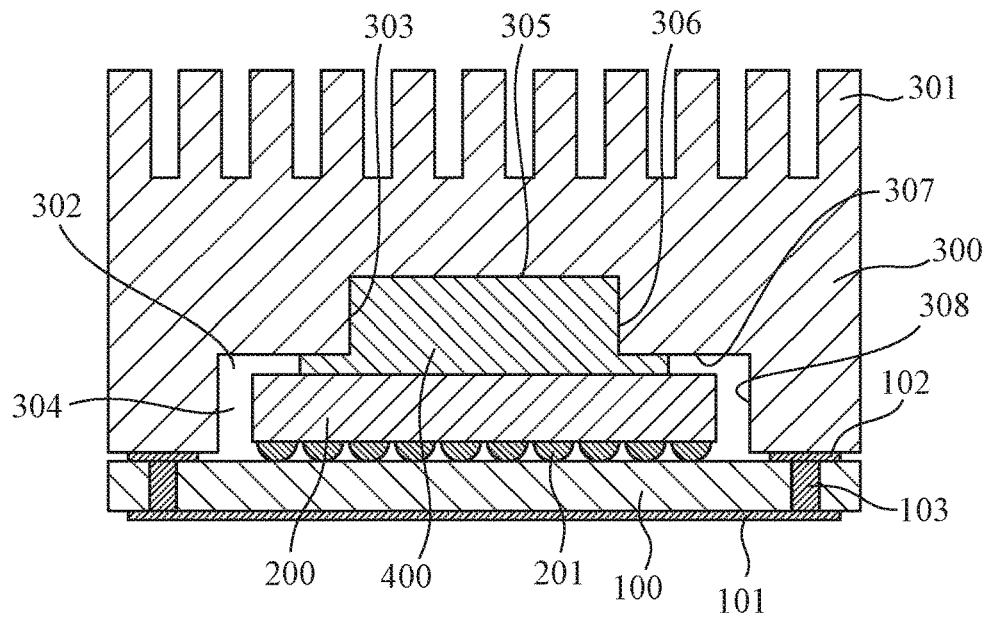
FIG. 4 is a cross-sectional view illustrating a first modified example of the electromagnetic shield structure of the high frequency circuit according to Embodiment 1 of the invention.

FIG. 4 illustrates a thermally conductive material 400 arranged to be in contact with not only the first side face 306 but also the second bottom face 307. In this configuration, the heat radiation performance can be further enhanced compared to the configuration of FIG. 1. Although the configuration in FIG. 4 results in a slightly lower cutoff frequency than that in FIG. 1, the cutoff frequency is kept to be sufficiently high compared to the reference example in FIG. 2.

Figure 5:
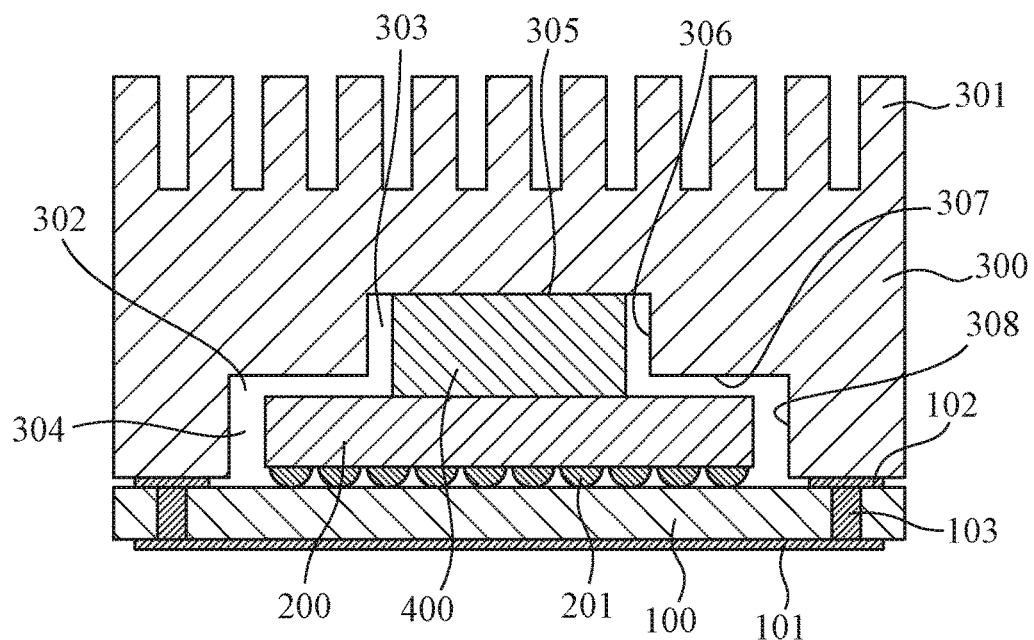
FIG. 5 is a cross-sectional view illustrating a second modified example of the electromagnetic shield structure of the high frequency circuit according to Embodiment 1 of the invention.

FIG. 5 illustrates a thermally conductive material 400 arranged to be spaced from the first side face 306. In this configuration, the cutoff frequency can be further increased compared to the configuration of FIG. 1. Although the configuration in FIG. 5 results in a slightly lower heat dissipation performance than that in FIG. 1, the heat dissipation performance is kept to be sufficiently high.

As described above, by changing the area where the thermally conductive material 400 is in contact with the metal housing 300, the balance between the cutoff frequency and the heat dissipation performance can be adjusted.

As described above, according to the electromagnetic shield structure of the high frequency circuit in Embodiment 1, the recess 302 accommodating the high frequency package 200 has a first space 303 and a second spaces 304 such that the cross section thereof is a winners podium shape, and the thermally conductive material 400 is arranged to be sandwiched between the metal housing 300 having the heat dissipating fins 301 and the high frequency package 200. Consequently, it is possible to increase the cavity resonant frequency or the waveguide cutoff frequency, and excellent heat dissipation performance can be achieved.

Further, the thermally conductive material 400 is designed to be in contact with the first side face 306. As a result, with keeping the cutoff frequency to be sufficiently high level, the heat radiation performance can be further enhanced.

Alternatively, the thermally conductive material 400 is designed to be in contact with the first side face 306 and the second bottom face 307. As a result, with keeping the cutoff frequency to be sufficiently high level, the heat radiation performance can be further enhanced.

Alternatively, the thermally conductive material 400 is designed to be spaced from the first side face 306. As a result, with keeping the heat dissipation performance to be sufficiently high level, the cutoff frequency can be further increased.

Embodiment 2

Figure 6:
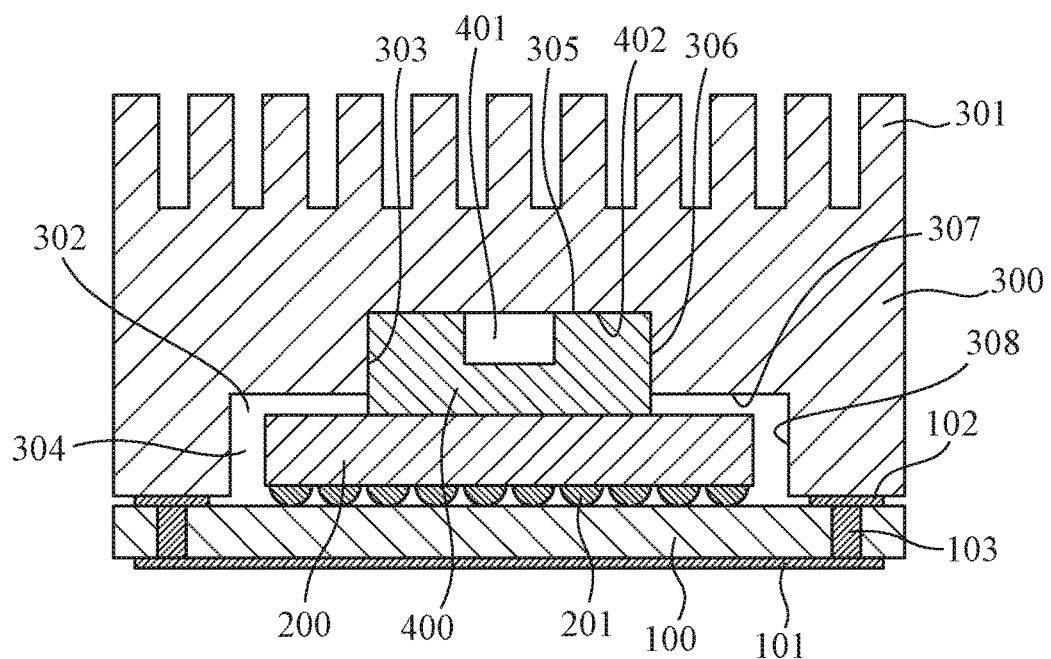
FIG. 6 is a cross-sectional view illustrating an electromagnetic shield structure of a high frequency circuit according to Embodiment 2 of the invention.

FIG. 6 is a cross-sectional view of a high frequency module for showing an electromagnetic shield structure of a high frequency circuit according to Embodiment 2 of the present invention.

The electromagnetic shield structure of the high frequency circuit according to Embodiment 2 differs from that according to Embodiment 1 in that the thermally conductive material 400 has a recess 401 forming a substantially rectangular parallelepiped cavity. Specifically, the recess 401 is formed in the central part of the face 402 facing the first bottom face 305 of the metal housing 300, namely, around the center of a resonator formed by a cavity structure into which electric field distribution is concentrated.

Next, some effects of the electromagnetic shield structure of the high frequency circuit that has the recess 401 in the thermally conductive material 400 will be described with reference to the results of an electromagnetic field analysis based on the finite element method.

Figure 7:
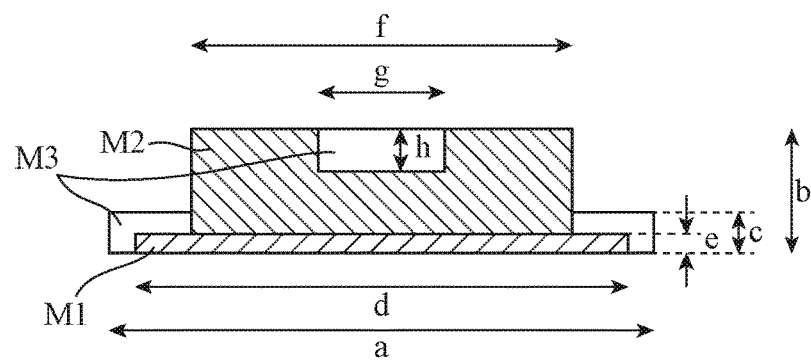
FIG. 7 is a structural view for an electromagnetic analysis of the electromagnetic shield structure of the high frequency circuit illustrated in FIG. 6.

FIG. 7 is a structural view for an electromagnetic field analysis being a cross-sectional view of a waveguide.

In the electromagnetic field analysis, the modeling is implemented as follows. The high frequency package 200 corresponds to silicon M1 having a relative permittivity of 10. The thermally conductive material 400 corresponds to thermally conductive material M2 having a relative permittivity of 4. The second space 304 and the cavity formed by the recess 401 correspond to the air M3 having a relative permittivity of 1. The dimensions shown in FIG. 7 are assumed to be the followings: a: 6.0 [mm], b: 1.5 [mm], c: 0.5 [mm], d: 5.0 [mm], e: 0.3 [mm], f: 4.0 [mm], g: 1.0 [mm], and h: 0.6 [mm].

As a result of the electromagnetic field analysis, the cutoff frequency of the waveguide shown in FIG. 7 is 15.6 [GHz]. As shown in this result, due to the recess 401 formed in the thermally conductive material 400, a cavity is formed at a site into which the electric field distribution is concentrated, and as a result, the cutoff frequency can be further increased.

Since a cavity is formed between the thermally conductive material 400 and the metal housing 300 due to the recess 401, air voids are barely generated in the interface between the thermally conductive material 400 and the metal housing 300 in assembly. Thus, the productivity is enhanced, and the manufacturing cost is reduced.

Figure 8:
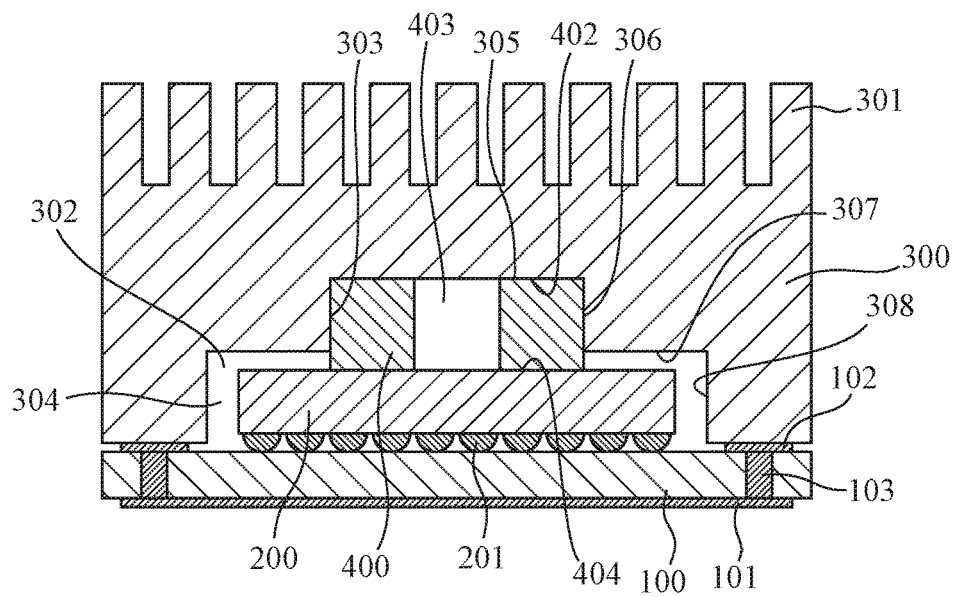
FIG. 8 is a cross-sectional view illustrating a first modified example of the electromagnetic shield structure of the high frequency circuit according to Embodiment 2 of the invention.

FIG. 8 illustrates a configuration in which the thermally conductive material 400 has a through-hole 403 instead of the recess 401. The through-hole 403 penetrates through the metal housing 300 to extend from the face 402 facing the first bottom face 305 to the face 404 facing the high frequency package 200.

Figure 9:
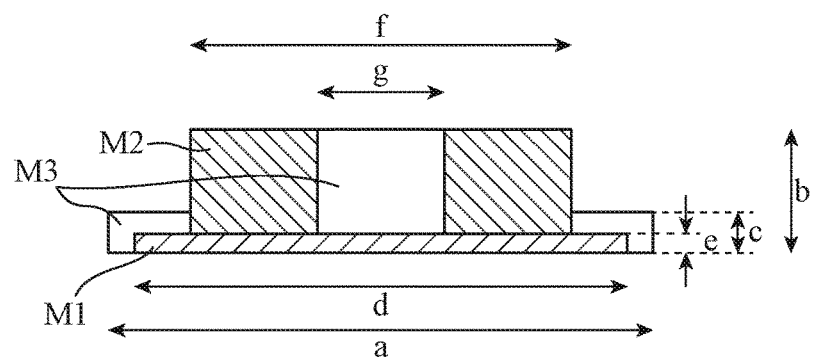
FIG. 9 is a structural view for an electromagnetic analysis of the electromagnetic shield structure of the high frequency circuit illustrated in FIG. 8.

Some effects of the electromagnetic shield structure of the high frequency circuit shown in FIG. 8 will be described with reference to the results of an electromagnetic field analysis based on the finite element method. FIG. 9 is a structural view for the electromagnetic field analysis being a cross-sectional view of a waveguide.

In the electromagnetic field analysis, the modeling is implemented as follows. The high frequency package 200 corresponds to silicon M1 having a relative permittivity of 10. The thermally conductive material 400 corresponds to thermally conductive material M2 having a relative permittivity of 4. The second space 304 and the cavity formed by the through-hole 403 correspond to the air M3 having a relative permittivity of 1. The dimensions shown in FIG. 9 are assumed to be the followings: a: 6.0 [mm], b: 1.5 [mm], c: 0.5 [mm], d: 5.0 [mm], e: 0.3 [mm], f: 4.0 [mm], and g: 1.0 [mm].

As a result of the electromagnetic field analysis, the cutoff frequency of the waveguide shown in FIG. 9 is 16.5 [GHz]. As shown in this result, also by forming the through-hole 403, the cutoff frequency can be further increased.

Figure 10:
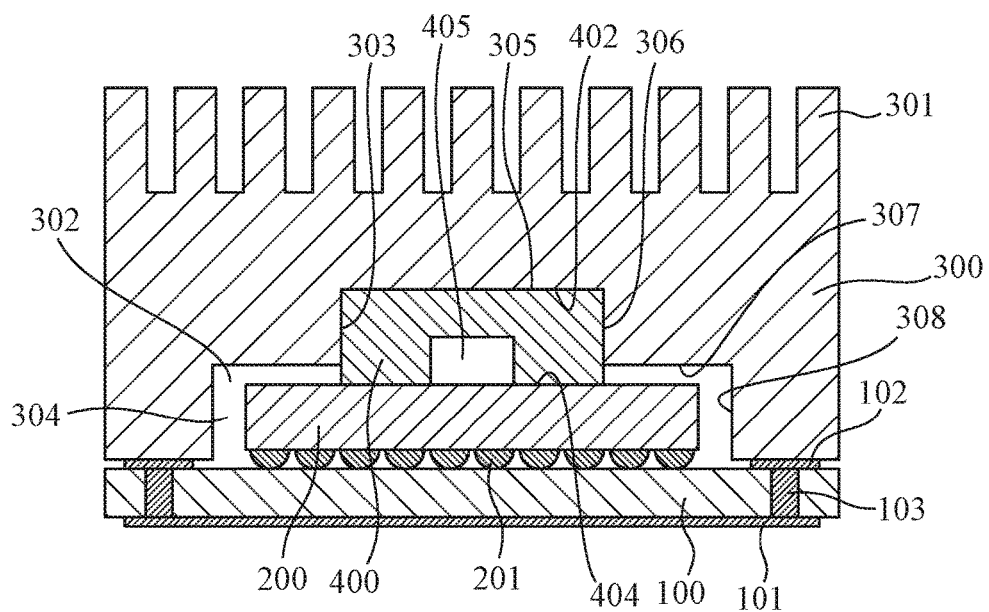
FIG. 10 is a cross-sectional view illustrating a second modified example of the electromagnetic shield structure of the high frequency circuit according to Embodiment 2 of the invention.
Figure 11:
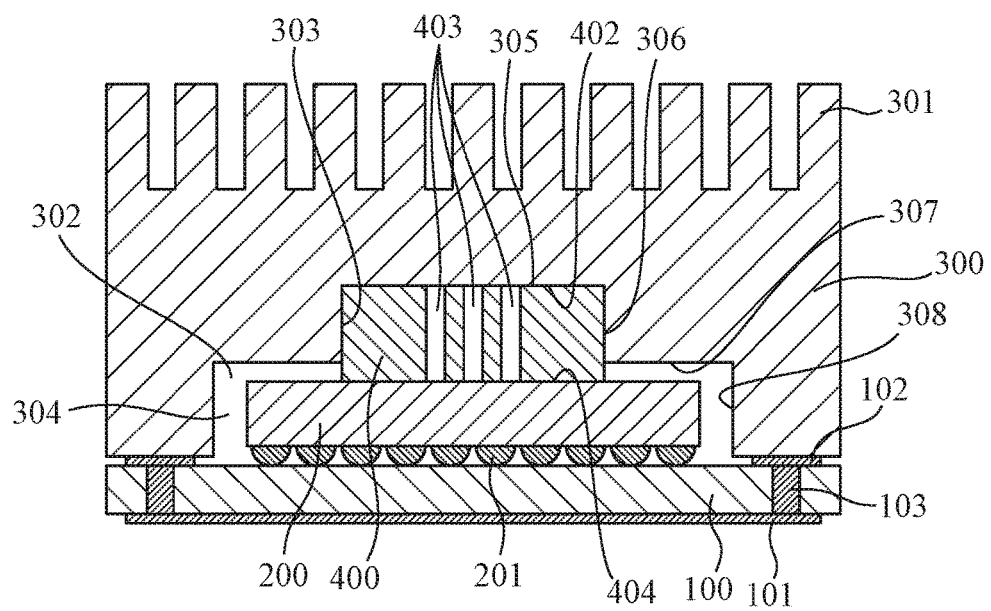
FIG. 11 is a cross-sectional view illustrating a third modified example of the electromagnetic shield structure of the high frequency circuit according to Embodiment 2 of the invention.

Further, FIG. 10 illustrates a configuration in which a thermally conductive material 400 has a substantially rectangular parallelepiped recess 405 on the face 404 instead of the recess 401 on the face 402. Moreover, FIG. 11 illustrates a configuration in which a thermally conductive material 400 has a plurality of through-holes 403. Also in these configurations, the cutoff frequency can be further increased compared to that in the Embodiment 1.

As described above, according to the electromagnetic shield structure of the high frequency circuit in Embodiment 2, the thermally conductive material 400 is designed to have the recess 401, the recess 405, or the through-hole(s) 403 for forming cavities. Due to such configurations, the waveguide cutoff frequency can be further increased compared to Embodiment 1.

Embodiment 3

Figure 12:
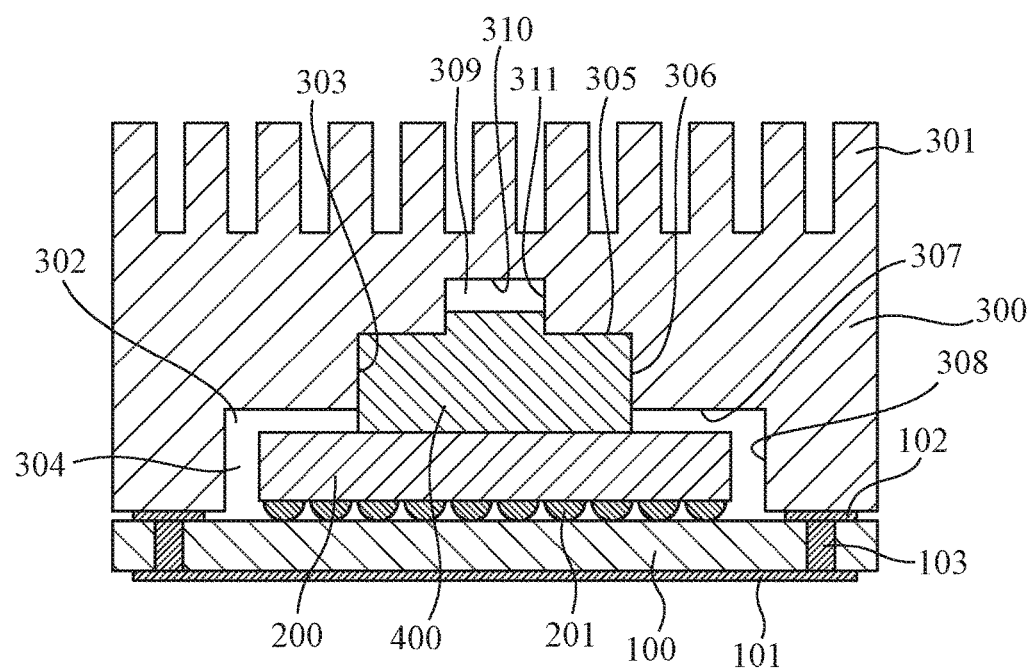
FIG. 12 is a cross-sectional view illustrating an electromagnetic shield structure of a high frequency circuit according to Embodiment 3 of the invention.

FIG. 12 is a cross-sectional view of a high frequency module for illustrating an electromagnetic shield structure of a high frequency circuit according to Embodiment 3 of the present invention.

In the electromagnetic shield structure of the high frequency circuit according to Embodiment 3, the cross-section of the recess 302 in the metal housing 300 has a three-step winners podium shape. The recess 302 having a three-step winners podium shape in cross-sectional view includes a third space 309 formed by a partially recessed first bottom face 305, in addition to the first space 303 and the second space 304. The third space 309 is a substantially rectangular parallelepiped shape formed by a third bottom face 310, facing the high frequency package 200 and sandwiching the thermally conductive material 400 with the high frequency package 200, and a third side face 311, standing from the third bottom face 310 toward the dielectric substrate 100. The third side face 311 is a set of faces connecting the first bottom face 305 and the third bottom face 310.

In the electromagnetic shield structure of the high frequency circuit in FIG. 12, the cross-section of the thermally conductive material 400 is a winners podium shape. A part of the thermally conductive material 400 is arranged in the third space 309 so as to be spaced from the third bottom face 310. In this manner, a cavity is formed between the third bottom face 310 of the metal housing 300 and the thermally conductive material 400, namely, around the center of a resonator formed by the cavity structure into which the electric field distribution is concentrated.

Next, some effects of the electromagnetic shield structure of the high frequency circuit according to Embodiment 3 will be described with reference to the results of an electromagnetic field analysis based on the finite element method.

Figure 13:
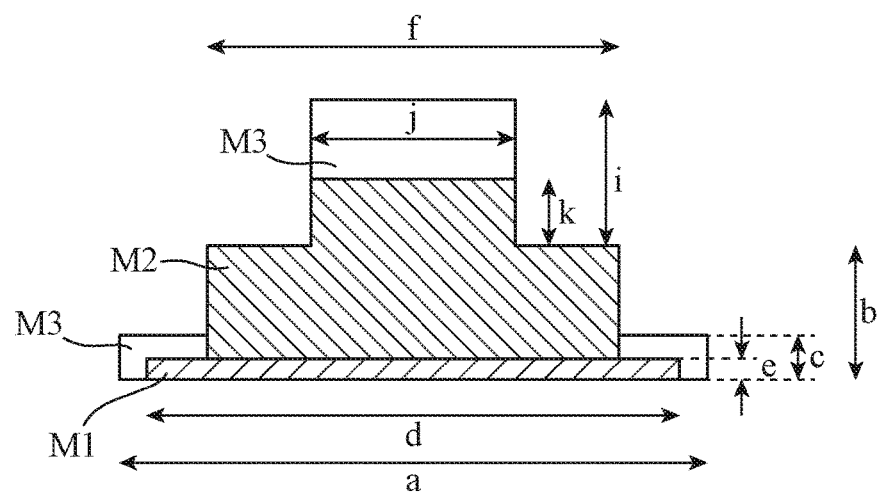
FIG. 13 is a structural view for an electromagnetic analysis of the electromagnetic shield structure of the high frequency circuit illustrated in FIG. 12.

FIG. 13 is a structural view for the electromagnetic field analysis being a cross-section of a waveguide.

In the electromagnetic field analysis, the modeling is implemented as follows. The high frequency package 200 corresponds to silicon M1 having a relative permittivity of 10. The thermally conductive material 400 corresponds to thermally conductive material M2 having a relative permittivity of 4. The second space 304 and the cavity formed between the third bottom face 310 and the thermally conductive material 400 correspond to the air M3 having a relative permittivity of 1. The dimensions shown in FIG. 13 are assumed to be the followings: a: 6.0 [mm], b: 1.5 [mm], c: 0.5 [mm], d: 5.0 [mm], e: 0.3 [mm], f: 4.0 [mm], i: 2.0 [mm], j: 2.0 [mm], and k: 1.0 [mm].

As a result of the electromagnetic field analysis, the waveguide cutoff frequency of the waveguide shown in FIG. 13 is 15.4 [GHz]. In this manner, by forming the third space 309, and arranging the thermally conductive material 400 to be spaced from the third bottom face 310, a cavity is formed in a site into which the electric field distribution is concentrated, and consequently, the cutoff frequency is further increased compared to Embodiment 1.

Further, similarly to Embodiment 2, air voids are barely generated in the interface between the thermally conductive material 400 and the metal housing 300 in assembly. Thus, the productivity is enhanced, and the manufacturing cost is reduced compared to Embodiment 1.

Figure 14:
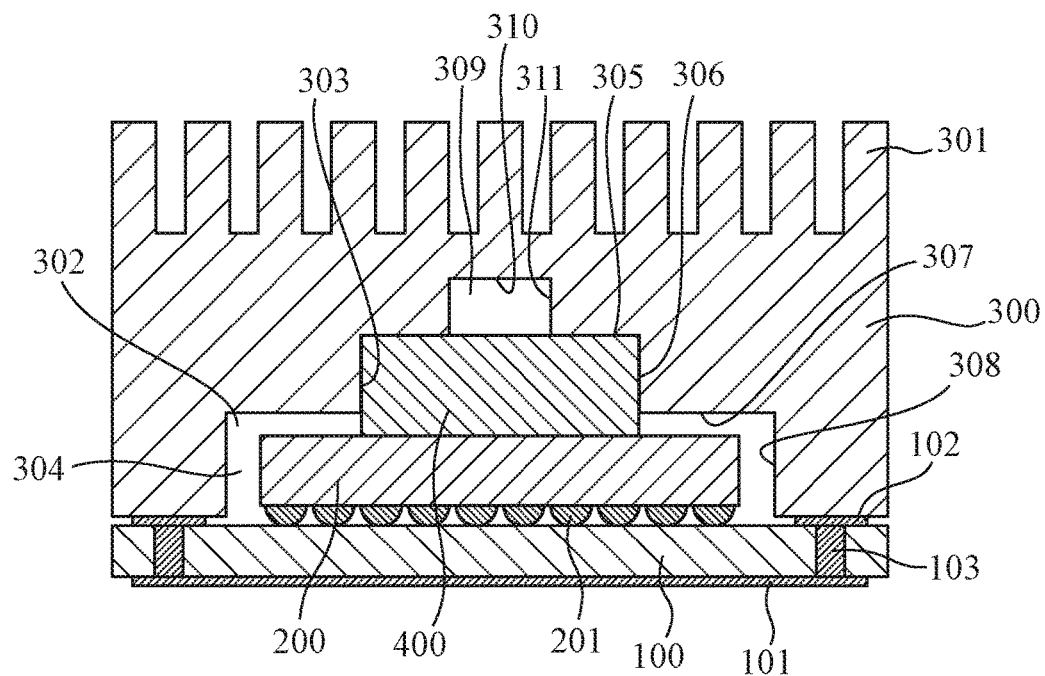
FIG. 14 is a cross-sectional view illustrating a first modified example of the electromagnetic shield structure of the high frequency circuit according to Embodiment 3 of the invention.

FIG. 14 illustrates a configuration in which a thermally conductive material 400 is not in contact with the third side face 311, namely, not disposed in the third space 309, so that the cavity between the third bottom face 310 and the thermally conductive material 400 is enlarged.

Figure 15:
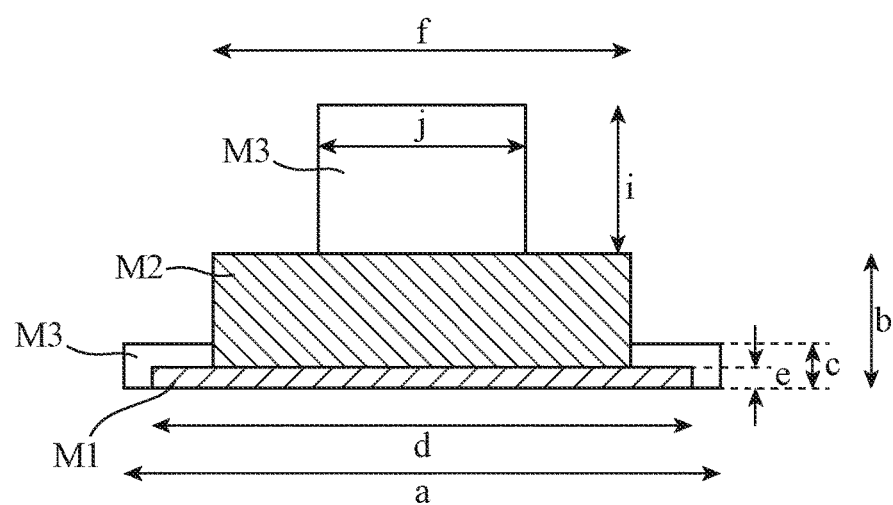
FIG. 15 is a structural view for an electromagnetic analysis of the electromagnetic shield structure of the high frequency circuit illustrated in FIG. 14.

Some effects of the electromagnetic shield structure of the high frequency circuit shown in the FIG. 14 will be described with reference to the results of an electromagnetic field analysis based on the finite element method. FIG. 15 is a structural view for the electromagnetic field analysis being a cross-section of a waveguide.

In the electromagnetic field analysis, the modeling is implemented as follows. The high frequency package 200 corresponds to silicon M1 having a relative permittivity of 10. The thermally conductive material 400 corresponds to thermally conductive material M2 having a relative permittivity of 4. The second space 304 and the cavity formed between the third bottom face 310 and the thermally conductive material 400 correspond to the air M3 having a relative permittivity of 1. The dimensions shown in FIG. 15 are assumed to be the followings: a: 6.0 [mm], b: 1.5 [mm], c: 0.5 [mm], d: 5.0 [mm], e: 0.3 [mm], f: 4.0 [mm], i: 2.0 [mm], and j: 2.0 [mm].

As a result of the electromagnetic field analysis, the cutoff frequency of the waveguide shown in FIG. 15 is 16.2 [GHz]. As shown in this result, by enlarging the cavity between the third bottom face 310 and the thermally conductive material 400, the cutoff frequency is further increased.

Figure 16:
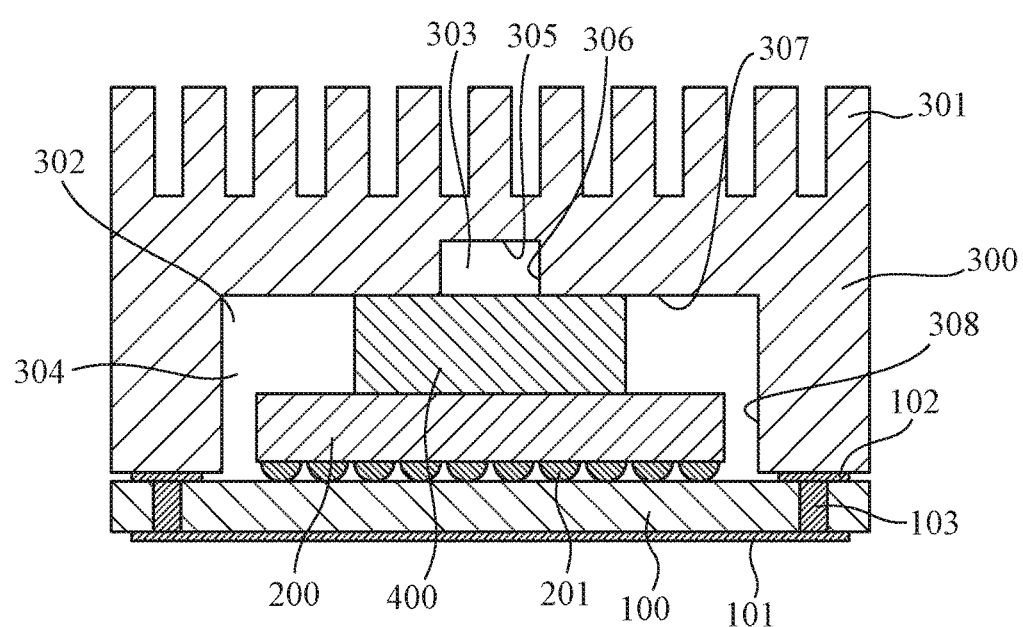
FIG. 16 is a cross-sectional view illustrating a second modified example of the electromagnetic shield structure of the high frequency circuit according to Embodiment 3 of the invention.

Further, FIG. 16 illustrates a configuration in which not only the high frequency package 200 but also the thermally conductive material 400 are arranged in the second space 304 in the recess 302 having a winners podium shape in cross-sectional view. The thermally conductive material 400 is sandwiched between the second bottom face 307 and the high frequency package 200 and arranged to be spaced from the first bottom face 305.

By providing a cavity between the first bottom face 305 and the thermally conductive material 400 as illustrated in FIG. 16, the same effects as the configurations in FIGS. 12 and 14 can be achieved.

As described above, according to the electromagnetic shield structure of the high frequency circuit of the Embodiment 3, a cavity is formed between the third bottom face 310 and the thermally conductive material 400, or the thermally conductive material 400 is arranged in the second space 304 to be spaced from the first bottom face 305. As a result, the waveguide cutoff frequency can be further increased compared to Embodiment 1.

It should be noted that the present invention can include any combination of embodiments, or modification or omission of any component in the embodiments within the scope of the invention.

INDUSTRIAL APPLICABILITY

As described above, the electromagnetic shield structure of the high frequency circuit according to the present invention can increase the cavity resonant frequency or the waveguide cutoff frequency and can enhance the heat dissipation performance of the high frequency circuit. The electromagnetic shield structure is thus suitable for use in a high frequency circuit in a high frequency module of, for example, wireless communication devices or radar devices.

REFERENCE SIGNS LIST

100 dielectric substrate
101, 102 grounding conductor
103 pillar conductor
200 high frequency package
201 solder bumps
300 metal housing
301 heat dissipating fins
302 recess
303 first space
304 second space
305 first bottom face
306 first side face
307 second bottom face
308 second side face
309 third space
310 third bottom face
311 third side face
400 thermally conductive material
401 recess
402 face
403 through-hole
404 face
405 recess
500 metal housing
501 recess

The invention claimed is:

1. An electromagnetic shield structure of a high frequency circuit, the electromagnetic shield structure comprising:
    a dielectric substrate provided with a grounding conductor and on which the high frequency circuit is mounted;
    a metal housing in which a recess accommodating the high frequency circuit is formed, fixed to the dielectric substrate to be electrically connected to the grounding conductor; and
    a thermally conductive material being electrically insulative,
    wherein the metal housing comprises a heat dissipation structure,
    the recess forms a first space and a second space, in which the first space is defined by a first bottom face which faces the high frequency circuit and a first side face which stands from the first bottom face, the second space is defined by a second bottom face which faces the high frequency circuit and is positioned in a shallower part in the recess than the first bottom face and a second side face which stands from the second bottom face, and the second space is formed to be protruded from the first space to an outer peripheral side,
    the high frequency circuit is accommodated in the second space to be spaced from the metal housing, and the thermally conductive material is sandwiched between the first bottom face and the high frequency circuit, and (the high frequency circuit is in the second space)
    the thermally conductive material is arranged to be spaced from the first side face and extends from below the first side face to the first bottom face.

2. A high frequency module comprising the electromagnetic shield structure and the high frequency circuit according to claim 1.

3. An electromagnetic shield structure of a high frequency circuit, the electromagnetic shield structure comprising:
- a dielectric substrate provided with a grounding conductor and on which the high frequency circuit is mounted;
- a metal housing in which a recess accommodating the high frequency circuit is formed, fixed to the dielectric substrate to be electrically connected to the grounding conductor; and
- a thermally conductive material being electrically insulative,
- wherein the metal housing comprises a heat dissipation structure,
- the recess forms a first space and a second space, in which the first space is defined by a first bottom face which faces the high frequency circuit and a first side face which stands from the first bottom face, the second space is defined by a second bottom face which faces the high frequency circuit and is positioned in a shallower part in the recess than the first bottom face and a second side face which stands from the second bottom face, and the second space is formed to be protruded from the first space to an outer peripheral side,
- the high frequency circuit is accommodated in the second space to be spaced from the metal housing, and the thermally conductive material is sandwiched between the first bottom face and the high frequency circuit; and
- the thermally conductive material has a recess being formed on either the first bottom face or a face that faces the high frequency circuit, or has a through-hole extending from a face that faces the first bottom face to a face that faces the high frequency circuit and the thermally conductive material extends from below the first side face to the first bottom face.

4. A high frequency module comprising the electromagnetic shield structure and the high frequency circuit according to claim 3.

5. An electromagnetic shield structure of a high frequency circuit, the electromagnetic shield structure comprising:
- a dielectric substrate provided with a grounding conductor and on which the high frequency circuit is mounted;
- a metal housing in which a recess accommodating the high frequency circuit is formed, fixed to the dielectric substrate to be electrically connected to the grounding conductor; and
- a thermally conductive material being electrically insulative,
- wherein the metal housing comprises a heat dissipation structure,
- the recess forms a first space and a second space, in which the first space is defined by a first bottom face which faces the high frequency circuit and a first side face which stands from the first bottom face, the second space is defined by a second bottom face which faces the high frequency circuit and is positioned in a shallower part in the recess than the first bottom face and a second side face which stands from the second bottom face; and the second space is formed to be protruded from the first space to an outer peripheral side,
- the recess further forms a third space formed on a part of the first bottom face being recessed, and defined by a third bottom face and a bird de face standing from the third bottom face,
- the high frequency circuit is accommodated in the second space to be spaced from the metal housing, and the thermally conductive material is sandwiched between the first bottom face and the high frequency circuit, and
- the thermally conductive material is arranged to be spaced from the third bottom face and extends from below the first side face to the third bottom face.

6. A high frequency module comprising the electromagnetic shield structure and the high frequency circuit according to claim 5.

7. An electromagnetic shield structure of a high frequency circuit, the electromagnetic shield structure comprising:
- a dielectric substrate provided with a grounding conductor and on which the high frequency circuit is mounted;
- a metal housing in which a recess accommodating the high frequency circuit is formed, fixed to the dielectric substrate to be electrically connected to the grounding conductor; and
- a thermally conductive material being electrically insulative,
- wherein the metal housing comprises a heat dissipation structure,
- the recess forms a first space and a second space, in which the first space is defined by a first bottom face which faces the high frequency circuit and a first side face which stands from the first bottom face, the second space is defined by a second bottom face which faces the high frequency circuit and is positioned in a shallower part in the recess than the first bottom face and a second side face which stands from the second bottom face, and the second space is formed to be protruded from the first space to an outer peripheral side,
- the high frequency circuit is accommodated in the second space to be spaced from the metal housing, and the thermally conductive material is sandwiched between the first bottom face and the high frequency circuit, and
- the thermally conductive material is sandwiched between the second bottom face and the high frequency circuit and spaced from the first bottom face.

8. A high frequency module comprising the electromagnetic shield structure and the high frequency circuit according the claim 7.

* * * * *